(12) United States Patent
Tolson

(10) Patent No.: US 7,020,230 B2
(45) Date of Patent: Mar. 28, 2006

(54) FREQUENCY SYNTHESIZER FOR DUAL MODE RECEIVER

(75) Inventor: Nigel J. Tolson, Puley-on-Thames (GB)

(73) Assignee: Tropian, Inc., Cupertino, CA (US)

( * ) Notice: Subject to any disclaimer, the term of this patent is extended or adjusted under 35 U.S.C. 154(b) by 569 days.

(21) Appl. No.: 10/040,534

(22) Filed: Dec. 28, 2001
(Under 37 CFR 1.47)

(65) Prior Publication Data

US 2003/0123596 A1    Jul. 3, 2003

(51) Int. Cl.
*H03D 3/24*     (2006.01)
*H04B 1/40*     (2006.01)
*H03K 9/00*     (2006.01)

(52) U.S. Cl. ........................ 375/376; 455/77; 375/316

(58) Field of Classification Search ................ 455/260, 455/77; 375/376, 316
See application file for complete search history.

(56) References Cited

U.S. PATENT DOCUMENTS

| | | | | |
|---|---|---|---|---|
| 5,535,432 A | * | 7/1996 | Dent | ............................ 455/77 |
| 5,668,837 A | * | 9/1997 | Dent | ............................ 375/316 |
| 6,725,463 B1 | * | 4/2004 | Birleson | ....................... 725/151 |

* cited by examiner

*Primary Examiner*—Stephen Chin
*Assistant Examiner*—Cicely Ware

(57) ABSTRACT

In a portable dual mode receiver circuit, a dual modulus clock system is provided which can, by selective use of integer division on a multiplied master clock, select specific channels with two different channel spacings in several different bands, providing power and space savings and achieving simplicity of operation.

7 Claims, 1 Drawing Sheet

FREQUENCY SYNTHESIZER FOR DUAL MODE RECEIVER

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

This invention relates to problems of clock generation in portable dual mode receiver circuits. The invention has particular application to cellular telephone technology where a single compact battery powered receiver must be able to operate on at least two disparate frequency bands. In particular, the invention relates to problems associated with generation of clock signals for digital cellular telephones operative in the AMP/PCS/GSM/EDGE bands (850 MHz, 900 MHz, 1900 MHz bands) which have 200 kHz channel spacing and in the IS136 band (~850 MHz band) which has 30 kHz channel spacing.

There is a need to minimize redundant components to save power and space in critical applications such as miniature portable cellular receiver circuit devices. The challenge is to provide a clock into the digital system which can divide down into both 200 kHz and 30 kHz to support the disparate channel spacing requirements. The clock must do so with an integer divider.

Current clock circuits known to the art generate a 13 MHz system clock. This clock frequency is incompatible with 30 kHz channel spacing, since it cannot be divided to 30 kHz by an integer.

What is therefore needed is a clock circuit which provides a compatible signal for all modes of operation.

SUMMARY OF THE INVENTION

According to the invention, in a portable dual mode receiver circuit, a dual mode clock system is provided which can, by selective use of integer division on a master clock, select specific channels with two different channel spacings in several different bands, providing power and space savings and achieving simplicity of operation. In a specific circuit embodiment according to the invention, a circuit is provided having a baseband clock circuit, a multiplier circuit coupled to the clock circuit for multiplying the baseband clock by a multiplier value to a master clock frequency which has as divisors a first integer corresponding to a first channel spacing of a first band and a second integer corresponding to a second channel spacing of a second band, a programmable reference divider coupled to receive a clock signal of the master clock frequency, the programmable divider being selectively operative at the first integer divider value and at the second integer divider value to produce respectively the first channel spacing clock signal and the second channel spacing clock signal. A digital phase detector is coupled to receive output of the programmable reference divider to detect phase of the first channel spacing clock signal and the second channel spacing clock signal. The digital phase detector has as a reference input a digital feedback signal for producing as output an analog phase error signal in the form of a steering voltage. A voltage controlled oscillator (VCO) is coupled to receive the phase error signal for generating a frequency controlled analog radio frequency (RF) signal at a desired frequency for system output. A programmable VCO divider circuit is coupled to receive the analog RF signal. The programmable VCO divider circuit divides the frequency of the analog RF signal by a first channel integer and a second channel integer, the first and second channel integers in combination with the respective first integer and the second integer designate a specific channel selection in the form of the digital feedback signal.

In a specific embodiment, the clock circuit is operative at 13 MHz. The multiplier first multiples the baseband section clock of 13 MHz by 3 to obtain a 39 MHz clock rate, then the divider divides by 1300 to achieve a 30 kHz channel spacing or divides 39 MHz by 195 to achieve a 200 kHz channel spacing. The channels are then selected by dividing the RF signal frequency by integers of about 25,000 to 30,000 or 4,000 to 1,000 to select the specific channels in the bands of interest.

The invention will be better understood by reference to the following detailed description in connection with the accompanying drawings.

DESCRIPTION OF SPECIFIC EMBODIMENTS

Figure 1:
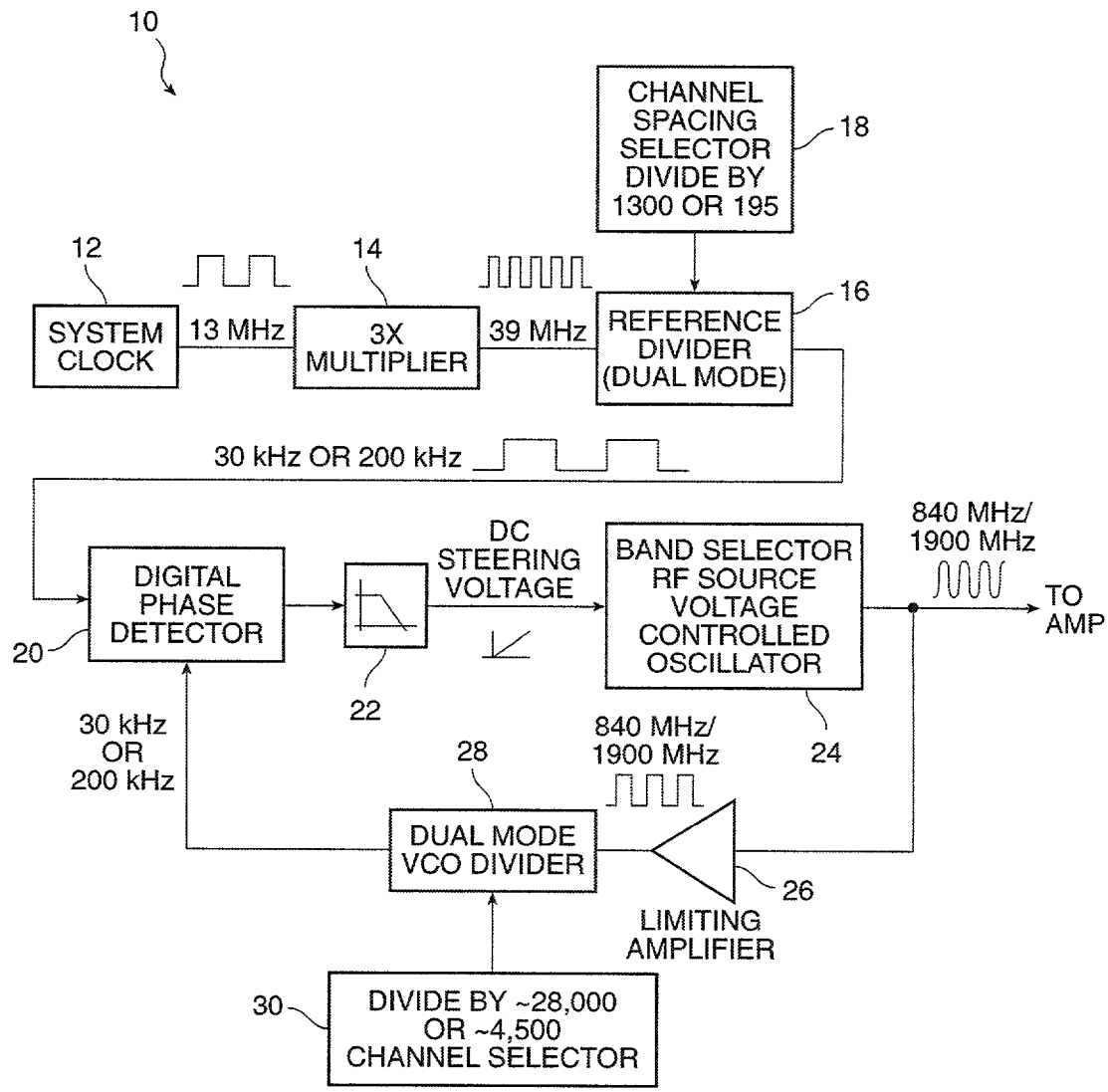
FIG. 1 is a block diagram of a dual modulus clock synthesizer according to the invention.

Referring to FIG. 1, there is shown a block diagram of a dual mode clock circuit 10 according to the invention using dual mode circuitry as hereinafter explained. The circuit 10 includes a system clock 12, a multiplier circuit 14 coupled to the clock 12 for multiplying the baseband clock signal by a multiplier value (in this instance by 3) to a master clock signal at a frequency which has as divisors a first integer corresponding to a first channel spacing of a first band, and a second integer corresponding to a second channel spacing of a second band.

The system clock 12 is typically operative to produce a square wave output at 13 MHz. The preferred master clock frequency is 39 MHz, which has as factors 1300 and 95. Accordingly, a programmable reference divider 16 is coupled to receive the master clock frequency signal. The programmable divider 16 is a subsystem which produces output square wave signals which are selective designated by by means of a channel spacing selector 18 or equivalent, which is operative to instruct the divider 16 to operate with a divisor of either the first integer value of 1300 or at the second integer value of 95 to produce respectively the first channel spacing clock signal of 30 kHz and the second channel spacing clock signal at 200 kHz.

A frequency synthesizer as hereinafter explained is controlled by these two clock signals. The synthesizer has a digital phase detector 20 coupled to receive output of the programmable reference divider 16 to detect the phase of both the first channel spacing clock signal and the second channel spacing clock signal. The digital phase detector 20 receives as a reference input a digital feedback signal to which it can lock. The digital phase detector 20 produces as output an analog phase error signal in form of a steering voltage after being filtered by a lowpass filter 22. The steering voltage is input to a voltage controlled oscillator (VCO) 24 which serves as the phase error signal. The VCO 24 serves as a band selector RF source which generates a frequency controlled analog radio frequency (RF) signal at one or the other of the desired frequency for system output, namely 840 MHz or 1900 MHz. These signals are fed to the amplifier stage of the host system. These signals are also fed into the feedback signal path where a limiting amplifier 26 yields amplitude-limited clock signals of the respective frequencies 840 MHz and 1900 MHz.

A programmable VCO divider circuit 28 is coupled to receive the clipped or square wave analog RF clock signals and is operative to divide the frequency of the input analog RF signal by either a first channel integer or a second channel integer supplied by a divide selector 30 or equivalent. The preferred integers are in the range of nominally between 25,000 and 30,000; or about 28,000 or in the range of nominally between 4,000 and 10,000, or about 4,500. These channel integers designate the exact channel of interest in combination with the respective integer divider values of the preferred embodiment of 1300 or 95. They not only designate the channel, they form the digital feedback signal.

In operation of a specific embodiment, the clock circuit first multiples the baseband section clock of 13 MHz by 3 to obtain the 39 MHz clock rate, then divides by 1300 to achieve a 30 kHz channel spacing or divides the 39 MHz by 195 to achieve a 200 kHz channel spacing. The channels are then selected by dividing the RF signal frequency by integers of between about 25,000 to 30,000 or 4,000 to 1,000 to select the specific channels in the bands of interest. These choices conform to the first standard of GSM and the second standard of IS-136.

The invention has been explained with reference to specific embodiments. Other embodiments will be evident to those of ordinary skill in the art. It is therefore not intended that this invention be limited, except as indicated by the appended claims.

What is claimed is:

1. A method for receiving multiple modes of RF signals according to different radio standards having differing channel spacings, including a first channel spacing in accordance with a first standard and a second channel spacing in accordance with a second standard, wherein the first channel spacing and the second channel spacing are not directly related by integer arithmetic, comprising:
   providing a reference frequency;
   using the reference frequency to generate channel frequencies for the first standard;
   frequency-multiplying the reference frequency by an integer number to produce a derived reference frequency; and
   generating channel frequencies for the other standard using a dual-modulus synthesizer and the derived reference frequency.

2. The method of claim 1, wherein the first standard is GSM and the second standard is IS-136.

3. A clock system for generating first clock signals for a portable wireless communication device operating in accordance with a first radio frequency network standard and second clock signals for the portable wireless communication device operating in accordance with a second radio frequency network standard, comprising:
   a multiplier circuit operable to multiply a clock signal by an integer multiplier value and provide a multiplied clock signal;
   a reference divider configured to receive the multiplied clock signal and selectively divide the multiplied clock signal by a first integer divisor or a second integer divisor, and provide a first channel spacing clock signal corresponding to a first radio frequency network standard or provide a second channel spacing clock signal corresponding to a second radio frequency network standard; and
   a digital frequency phase detector coupled to the reference divider and operable to detect the phase of the first channel spacing clock signal or the phase of the second channel spacing clock signal.

4. The clock system of claim 3, further comprising a voltage controlled oscillator (VCO) configured to receive a steering voltage from said digital frequency phase detector and generate radio frequency signals in a band of the first radio frequency network standard or a band of the second radio frequency network standard.

5. The clock system of claim 4 wherein the VCO is further configured to operate as a band selector.

6. The clock system of claim 4, further comprising a divider circuit configured to receive a digitized version of the radio frequency signals in the band of the first radio frequency network standard or a digitized version of the radio frequency signals in the band of the second radio frequency network standard, said divider circuit operable to selectively divide the digitized version of the radio frequency signals in the band of the first radio frequency network standard or the digitized version of the radio frequency signals in the band of the second radio frequency network standard by a first channel integer or a second channel integer.

7. The clock system of claim 6 wherein the divider circuit is configured to provide a reference signal to which the digital frequency phase detector can lock onto.

* * * * *